US011237998B2

(12) United States Patent
Schulz et al.

(10) Patent No.: US 11,237,998 B2
(45) Date of Patent: Feb. 1, 2022

(54) INTERFACE BRIDGE BETWEEN INTEGRATED CIRCUIT DIE

(71) Applicant: Intel Corporation, Santa Clara, CA (US)

(72) Inventors: Jeffrey Erik Schulz, Milpitas, CA (US); David W. Mendel, Sunnyvale, CA (US); Dinesh D. Patil, Sunnyvale, CA (US); Gary Brian Wallichs, San Jose, CA (US); Keith Duwel, San Jose, CA (US); Jakob Raymond Jones, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/131,404

(22) Filed: Dec. 22, 2020

(65) Prior Publication Data

US 2021/0109883 A1    Apr. 15, 2021

Related U.S. Application Data

(63) Continuation of application No. 16/536,147, filed on Aug. 8, 2019, now Pat. No. 11,100,029, which is a
(Continued)

(51) Int. Cl.
*H01L 25/065* (2006.01)
*G06F 13/40* (2006.01)
(Continued)

(52) U.S. Cl.
CPC ........ *G06F 13/4045* (2013.01); *G06F 13/385* (2013.01); *G06F 13/42* (2013.01);
(Continued)

(58) Field of Classification Search
CPC ......... G06F 13/40; G06F 13/42; H01L 23/52; H01L 25/0655
See application file for complete search history.

(56) References Cited

U.S. PATENT DOCUMENTS

| 2010/0158023 A1 | 6/2010 | Mukhopadhyay et al. |
| 2014/0016404 A1 | 1/2014 | Kim et al. |

(Continued)

FOREIGN PATENT DOCUMENTS

| EP | 3104277 A1 | 12/2016 |
| WO | 2010045081 A2 | 4/2010 |

OTHER PUBLICATIONS

Bolsens, Ivo; "2.5D ICs: Just a Stepping Stone or a Long Term Alternative to 3D?;" Xilinx, 2011 (29 pages).
(Continued)

*Primary Examiner* — David E Martinez
(74) *Attorney, Agent, or Firm* — Fletcher Yoder P.C.

(57) ABSTRACT

An interface bridge to enable communication between a first integrated circuit die and a second integrated circuit die is disclosed. The two integrated circuit die may be connected via chip-to-chip interconnects. The first integrated circuit die may include programmable logic fabric. The second integrated circuit die may support the first integrated circuit die. The first integrated circuit die and the secondary integrated circuit die may communicate with one another via the chip-to-chip interconnects using an interface bridge. The first and second component integrated circuits may include circuitry to implement the interface bridge, which may provide source-synchronous communication using a data receive clock from the second integrated circuit die to the first integrated circuit die.

54 Claims, 9 Drawing Sheets

Related U.S. Application Data continuation of application No. 15/392,225, filed on Dec. 28, 2016, now Pat. No. 10,445,278.

(51) Int. Cl.
| | |
|---|---|
| *G06F 13/42* | (2006.01) |
| *H01L 23/498* | (2006.01) |
| *H01L 23/00* | (2006.01) |
| *G06F 13/38* | (2006.01) |
| *H03K 19/173* | (2006.01) |
| *H04W 56/00* | (2009.01) |

(52) U.S. Cl.
CPC .... *G06F 13/4291* (2013.01); *H01L 23/49838* (2013.01); *H01L 24/16* (2013.01); *H01L 25/0655* (2013.01); *H03K 19/1736* (2013.01); *H01L 2224/16225* (2013.01); *H01L 2924/1431* (2013.01); *H04W 56/0015* (2013.01)

(56) References Cited

U.S. PATENT DOCUMENTS

| | | |
|---|---|---|
| 2014/0175666 A1 | 6/2014 | Rahman et al. |
| 2017/0170153 A1* | 6/2017 | Khare ................. H01L 23/5386 |
| 2017/0171111 A1* | 6/2017 | Khare ................... H04L 49/109 |
| 2021/0109882 A1* | 4/2021 | Ngo ........................ G06F 5/065 |

OTHER PUBLICATIONS

Extended European Search Report for EP19200709.4 dated Feb. 5, 2020, pp. 1-8.

\* cited by examiner

INTERFACE BRIDGE BETWEEN INTEGRATED CIRCUIT DIE

CROSS-REFERENCE TO RELATED APPLICATIONS

This application is a continuation of U.S. patent application Ser. No. 16/536,147, filed Aug. 8, 2019, entitled, "Interface Bridge Between Integrated Circuit Die," which is a continuation of U.S. Patent Application No. U.S. patent application Ser. No. 15/392,225, filed Dec. 28, 2016, entitled, "Interface Bridge Between Integrated Circuit Die," the disclosures of which are incorporated by reference in their entireties for all purposes. U.S. patent application Ser. No. 15/392,209, filed Dec. 28, 2016, entitled "Seemingly Monolithic Interface Between Separate Integrated Circuit Die," is incorporated by reference in its entirety for all purposes.

BACKGROUND

This disclosure relates to an interface bridge for efficient communication between a first integrated circuit die that includes programmable logic and a second integrated circuit die that supports the first integrated circuit die.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuit devices are used in numerous electronic systems. Computers, handheld devices, portable phones, televisions, industrial control systems, robotics, and telecommunication networking—to name just a few—all use integrated circuit devices. Integrated circuit devices may be formed using lithography techniques that pattern circuitry onto a substrate wafer that is diced to form a number of (generally identical) individual integrated circuit die. Each integrated circuit die may include many different components, such as programmable logic fabric, digital or analog signal transmission circuitry, digital signal processing circuitry, application-specific data processing circuitry, memory, and so forth. In general, different components may be based on different underlying technologies. Thus, different components of an integrated circuit device may be better suited to different development cycles or fabrication techniques. For example, programmable logic fabric such as field programmable gate array (FPGA) fabric may scale well to smaller sizes and thus may benefit from greatly by newer lithography techniques. On the other hand, other technologies, such as certain analog signal transmission circuitry, may not scale as well and may be better suited for older fabrication techniques.

To enable different components of an integrated circuit device to be developed more independently, some of the components may be moved off-chip. Instead of a single monolithic design, a first integrated circuit die with some of the components may be fabricated separately from a second integrated circuit die with other components. As such, the various separate integrated circuit die may be fabricated using different lithography techniques or generations, and may be developed according to different schedules. Yet separating the components onto separate die may come at a cost. Namely, it may be difficult or impossible to use the same number of wires between the separate first integrated circuit die and the second integrated circuit die.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

An interface bridge to enable communication between a first integrated circuit die and a second integrated circuit die is provided. The two integrated circuit die may be connected via chip-to-chip interconnects of a silicon bridge. The first integrated circuit die may include programmable logic fabric. The second integrated circuit die may support the first integrated circuit die. The first integrated circuit die and the secondary integrated circuit die may communicate with one another via the chip-to-chip interconnects using an interface bridge. The first and second component integrated circuits may include circuitry to implement the interface bridge, which may provide source-synchronous communication using a data receive clock from the second integrated circuit die to the first integrated circuit die.

In another example, a method includes receiving, from a network connection of a transceiver, configuration signals for programmable logic fabric of a first integrated circuit die. The transceiver may be disposed in a second integrated circuit die separate from the first integrated circuit die. The configuration signals may be communicated via a source-synchronous connection from the second integrated circuit die to the first integrated circuit die.

In another example, an integrated circuit device includes a programmable logic fabric and an interface to a second integrated circuit device comprising a plurality of interconnect points that correspond to respective interconnect points of the second integrated circuit device. The interconnect points may be arranged in pairs that can be selectively configured by the interface to be one of: two single-ended inputs, two single-ended outputs, a differential input, and a differential output. At least some of the pairs may be able to be selectively configured by the interface to be: data pins, combinatorial pins, and clock pins. The interface may permit configuration signals to be received from the second integrated circuit device to configure the programmable logic fabric of the first integrated circuit device.

Various refinements of the features noted above may be made in relation to various aspects of the present disclosure. Further features may also be incorporated in these various aspects as well. These refinements and additional features may be made individually or in any combination. For instance, various features discussed below in relation to one or more of the illustrated embodiments may be incorporated into any of the above-described aspects of the present invention alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
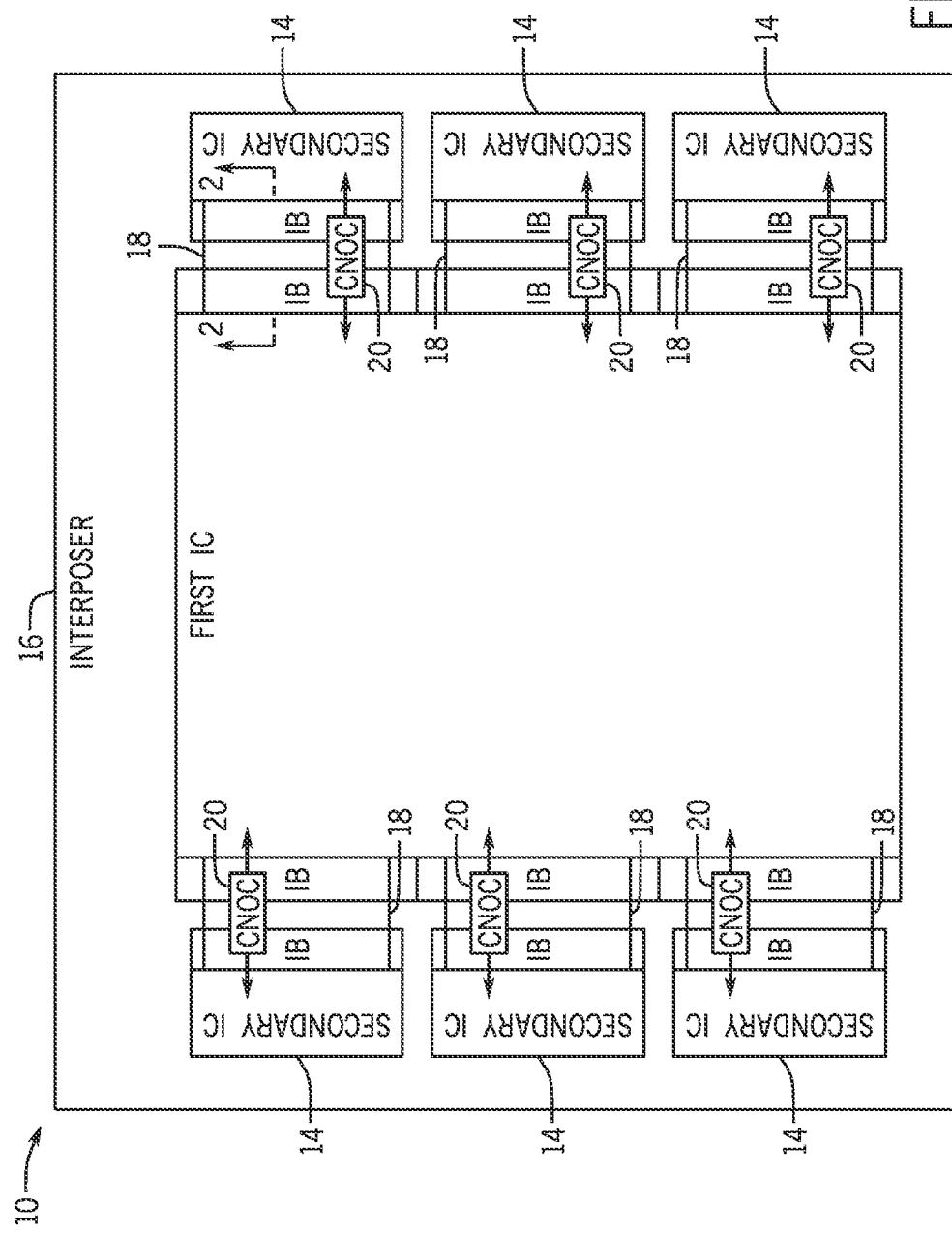
FIG. 1 is a block diagram of a multi-die integrated circuit system with an interface bridge to facilitate efficient communication between the die, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

A multi-chip system may be represented as a 3D or 2.5D system of separate integrated circuit dies that communicate signals between each other in an efficient matter. A 3D interconnection involves stacking integrated circuit die on top of each other, while a 2.5D interconnection involves connecting integrated circuit die through some form of silicon bridge, such as a silicon interposer, a bridge structure disposed in a substrate (e.g., an Embedded Multi-die Interconnect Bridge (EMIB) by Intel Corporation), or a direct connection from stacking one die on top of another. In either a 3D or 2.5D arrangement, the number of connections available between the die may be fewer than may be available if the multiple die were instead part of a single monolithic integrated circuit die. There are many reasons to separate the integrated circuit die, however, rather than combine them into a single monolithic integrated circuit die. In particular, some technologies, such as analog technologies used in high-speed transceivers, may not scale as easily to newer lithography techniques as other circuitry, such as programmable fabric of a programmable logic device (PLD), such as field programmable gate array (FPGA) fabric. When different die are separated, however, the once-monolithic communication between them may be replaced with an efficient interface bridge communication system, such as the systems described in this disclosure.

Efficient communication between integrated circuit die may be obtained between different integrated circuit die that are separate, rather than part of a single, monolithic integrated circuit device. In some cases, it may be desirable to maintain communication between the integrated circuit die as if they were connected in a monolithic solution. That is, from the perspective of each separate integrated circuit die, it may be advantageous to appear to be monolithically connected in one larger integrated circuit die.

In a particular example involving programmable logic device (PLD) fabric, such as FPGA fabric, there may be a potentially wide variety of secondary integrated circuit die that may be connected to a first, main FPGA integrated circuit die. These secondary integrated circuit die may include a transceiver, digital processing circuitry, a central processing unit (CPU) subsystem, parallel input/output (I/O) off loading, digital signal processing (DSP) arrays, and the like. In addition, programmable logic fabric may be capable of being configured using a set of programming instructions (a configuration bitstream) received from an external source, such as a network or memory device. Thus, the interface bridge of this disclosure may appear to operate from the perspective of the user in the same way as previously available monolithic solutions.

With this in mind, systems and methods for providing an interface bridge between two integrated circuit die are provided. In particular, in at least some examples, one of the integrated circuit die may include programmable logic fabric, such as FPGA fabric. The interface bridge may provide efficient, compact interconnection between the different die. The interface bridge may use a source-synchronous connection to eliminate problems of synchronous crossing across the interface bridge, using adaptive logic in the base die to make return signals appear to be synchronous. Moreover, the interface bridge may operate as a layered protocol. That is, the interface bridge may use a hardened physical input/output (I/O) layer that operates under the control of a higher-level protocol layer that may be formed from hardened or soft logic. As mentioned above, the interface bridge may enable a variety of different integrated circuit die to be interconnected, such as a transceiver, a circuitry for digital protocol processing, a CPU subsystem, parallel I/O off loading, and other data processing offloading, such as DSP arrays or graphics processing unit (GPU) processors.

Configuring the programmable logic fabric may be supported through a configuration network on chip (CNOC) connection supported by the interface bridge protocol. This may permit multiple security levels, such as secure and insecure attached die. This may also allow for secure areas of the programmable logic fabric the base die to be separated (e.g., via firewall circuitry) from external access from a connected secondary integrated circuit die.

The interface bridge may also provide several forms of redundancy. This redundancy may include active redundancy to route around failed physical interconnections; passive redundancy in which higher-priority status signals are transmitted twice over two different connections; and/or encoded redundancy to reconstruct a signal despite errors, which may support configuration of the programmable logic fabric of the base die and allow for initial configuration signals to be used to redundantly configure the interconnect bridge.

Furthermore, the interface bridge may support multiple defined signal transfer protocols, such as a serial shift chain implementation, which may enable slowly transitioning signals to be communicated across the interface in a time-efficient fashion, a register memory-mapped bus communication protocol, and/or a data bus transfer communication protocol. The interface bridge may also permit the interconnections to be grouped into pairs. Each pair may be configurable as universal pins that can operate as two single-ended inputs, two single-ended outputs, a differential input, or a differential output.

With this in mind, an example integrated circuit (IC) system 10 includes a first integrated circuit (IC) die 12 connected to any suitable number of secondary integrated circuit (IC) die 14. The first IC die 12 and the secondary IC die 14 may be connected through any suitable conductive bridge, such as a silicon bridge 16 or a bridge structure disposed in a substrate (e.g., an Embedded Multi-die Interconnect Bridge (EMIB) by Intel Corporation), or a direct connection between the first IC die 12 and the secondary IC die 14. The first IC die 12 and the secondary IC die 14 may be any suitable integrated circuit devices. In one example, the first IC die 12 is an integrated circuit device that includes programmable logic fabric and the secondary IC die 14 are high-speed transceivers. The IC system 10 may benefit from the separateness of the first IC die 12 and secondary IC die 14 because the underlying technologies of these die may be different. As such, they may be developed in a more modularized way that is appropriate to the technology of each die.

While the examples provided below may refer to the first IC die 12 as a programmable logic device and refer to the secondary IC die 14 as high-speed transceivers, other types of integrated circuit devices may benefit from this disclosure. These may include digital processing circuitry, a central processing unit (CPU) subsystem, parallel input/output (I/O) off loading, digital signal processing (DSP) arrays, and the like.

The first IC die 12 may connect to the secondary IC die 14 through physical chip-to-chip interconnects of the silicon bridge 16 via a logical interface bridge (IB) 18 that controls the way signals are sent and received. That is, as used herein, the interface bridge 18 represents a logical connection between the first IC die 12 and the secondary IC die 14. The interface bridge 18 handles signal transfer between physical chip-to-chip interconnects of the silicon bridge 16.

The interface bridge 18 may allow a configuration network on chip (CNOC) 20 interface to extend between the first IC die 12 to the secondary IC die 14. The CNOC 20 allows configuration signals from the secondary IC die 14 to enter the first IC die 12 to be used to program programmable logic fabric of the first IC die 12. Even so, it should be understood that other types of integrated circuit die may be used that use other aspects of the interface bridge 18, but which do not provide the CNOC 20 because the first IC die 12 may not include the programmable logic fabric in all embodiments. Still, the interface bridge 18 may be particularly useful when the first IC die 12 contains programmable logic fabric, such as FPGA fabric.

Figure 2:
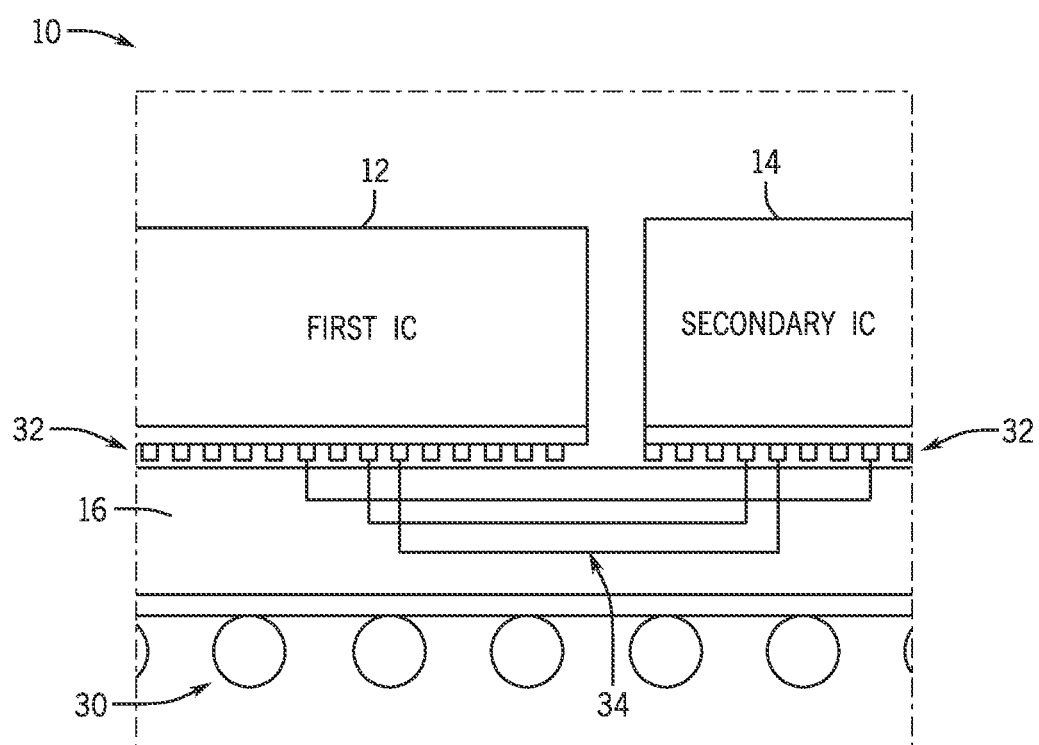
FIG. 2 is a schematic cross-sectional view of a portion of the integrated circuit system of FIG. 1, in accordance with an embodiment.

FIG. 2 shows a schematic cross-sectional view of the IC system 10 along cut lines 2-2 of FIG. 1. As may be seen in FIG. 2, the silicon bridge 16 may be an interposer (as shown) or may be any other suitable silicon bridge (e.g., an interconnect bridge such as an Embedded Multi-die Interconnect Bridge (EMIB) by Intel Corporation) disposed on substrate. In other examples, the first IC die 12 and the secondary IC die 14 may be directly connected to one another through a form of stacking. In the example shown in FIG. 2, the silicon bridge 16 represents an interposer that uses a ball grid array (BGA) of solder balls 30, which may electrically connect to other circuitry, such as a printed circuit board (PCB) (not shown). The physical interconnection between the first IC die 12 and the secondary IC die 14 occurs through corresponding respective interconnect points 32 (here, taking the form of microbumps), which couple to each other through chip-to-chip interconnects 34 within the silicon bridge 16.

It should be understood that FIG. 2 represents a 2.5D arrangement that uses a silicon bridge 16 to connect the first IC die 12 and the secondary IC die 14. In other embodiments, the first IC die 12 and the secondary IC die 14 may be connected in a 3D arrangement, in which case the interconnect points 32 may directly connect to the other IC. For instance, the secondary IC die 14 may be stacked on top of the first IC die 12 and the interconnect points 32 may directly connect to corresponding interconnect structures on the first IC die 12.

In either a 2.5D or 3D arrangement, the first IC die 12 and the secondary IC die 14 may communicate through a relatively limited number of physical connections in relation to the number of connections that might be possible in a monolithic interface (i.e., if the first IC die 12 and the secondary IC die 14 were patterned onto a single monolithic integrated circuit die). To account for the limited number of physical connections between the first IC die 12 and the secondary IC die 14, the interface bridge 18 may efficiently communicate a variety of types of signals over the limited number of connections.

Figure 3:
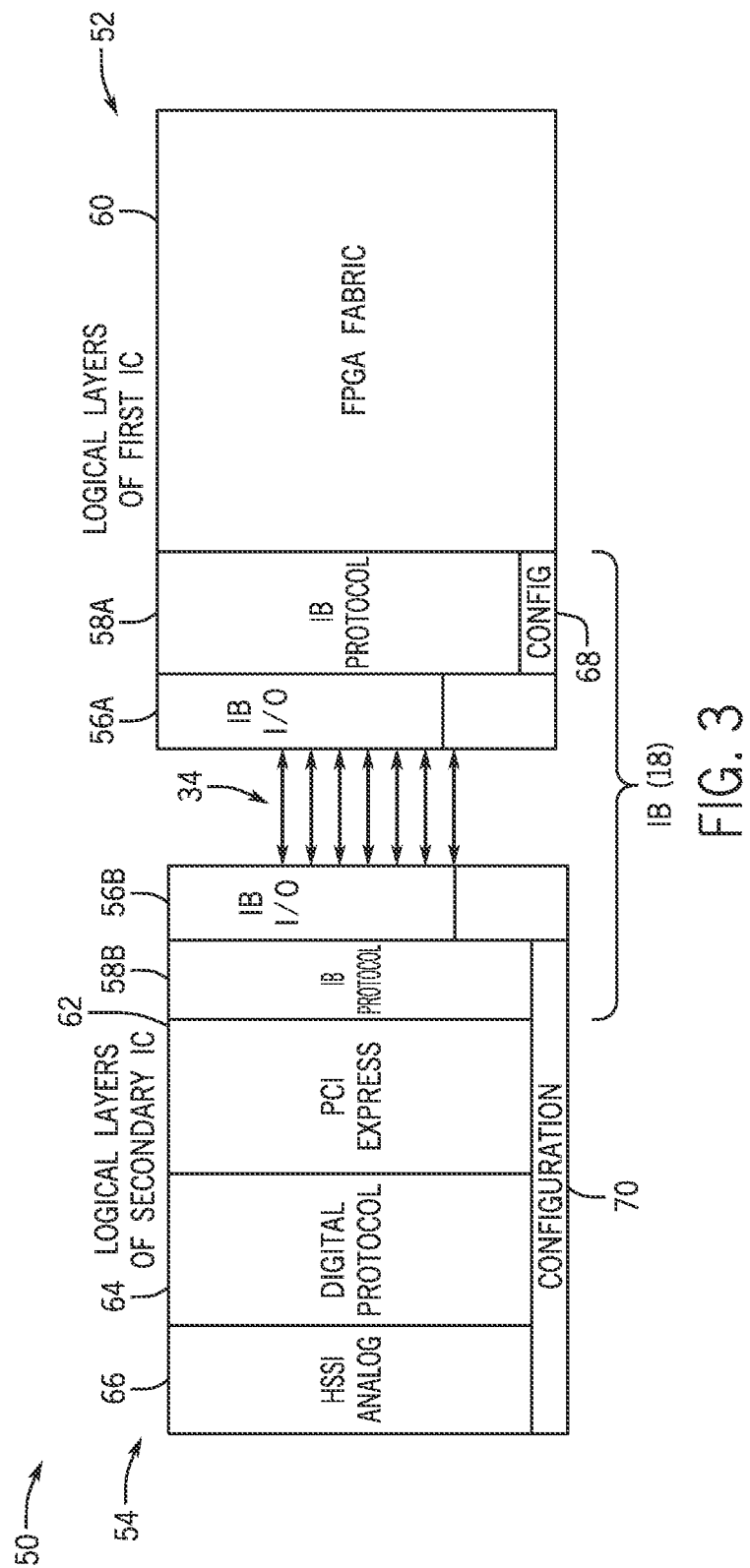
FIG. 3 is a block diagram illustrating logical layers of the circuitry of the interface bridge of the integrated circuit system of FIG. 1, in accordance with an embodiment.

In support of this, the interface bridge 18 may be logically divided into several logical layers, as shown by a layer diagram 50 of FIG. 3. In particular, the layer diagram 50 shows different logical layers 52 of the first IC die 12 and logical layers 54 of the secondary IC die 14 when the secondary IC die 14. The particular example of FIG. 3 illustrates logical layers that may be present when the secondary IC die 14 includes high speed serial interface (HSSI) transceiver circuitry and the first IC die 12 includes field programmable gate array (FPGA) fabric. The interface bridge 18 may be understood logically as formed by a physical input/output (I/O) layer 56A and a higher-level IB protocol layer 58A on the first IC die 12, and a corresponding physical I/O layer 56B and higher-level IB protocol layer 58B on the side of the secondary IC die 14. The physical I/O layers 56A and 56B are physically connected to one another via the chip-to-chip interconnects 34.

The IB I/O layers 56A and 56B represent physical layers that transmit signals to, or receive signals from a corresponding interconnect point over the chip-to-chip interconnects 34. The physical IB I/O layers 56A thus may include circuitry to drive signals over the chip-to-chip interconnects 34 and/or receive signals from the chip-to-chip interconnects 34. Generally speaking, the physical IB/O layers 56A and 56B may be implemented through hardened logic circuitry. In some embodiments, however, the physical I/O layers 56A and/or 56B may be at least partially formed through programmable fabric that has been configured to operate as the physical IB I/O layer.

The higher-level IB protocol layers 58A and 58B represent logical layers that operate on top of the physical operation of the physical IB I/O layers 56A and 56B, respectively, to make the communication that takes place over the interface bridge 18 as seamless as possible. That is, when higher-level communication interacts with the interface bridge 18, the higher-level communication may not "see" the operation of the IB protocol layers 58A and 58B or the physical signal transmissions that occur in the physical IB I/O layers 56A and 56B. The IB 18 may appear to be invisible (e.g., a "black box") from the perspective of higher-level layers.

Some of the higher-level logical layers may include, on the first IC die 12, an FPGA fabric layer 60. The FPGA fabric layer 60 may communicate any suitable logical controls over the interface bridge 18 as if the FPGA fabric 60 were monolithically connected to the secondary IC die 14. For instance, the FPGA fabric 60 may operate using asynchronous status or control signals that may be received from the secondary IC die 14 via a source-synchronous connection over the IB 18.

The secondary IC die 14 may also include higher-level logical layers such as a PCI express layer 62, a digital protocol layer 64, and/or an HSSI analog layer 66. These may be understood to represent various functions or operations that the secondary IC die 14 may be capable of performing. In the particular example of FIG. 3, these functions represent operational capabilities of an HSSI transceiver. However, other functions may take the place of these logical layers when the secondary IC die 14 includes other circuitry, such as memory circuitry. For example, when the secondary IC die 14 includes memory, the other logical layers beyond the interface bridge 18 layers 56B and 58B may include random access memory (RAM) functions. When the IC die 14 includes a central processing unit (CPU), the higher-level logical layers may include CPU data-processing functions.

Figure 14:
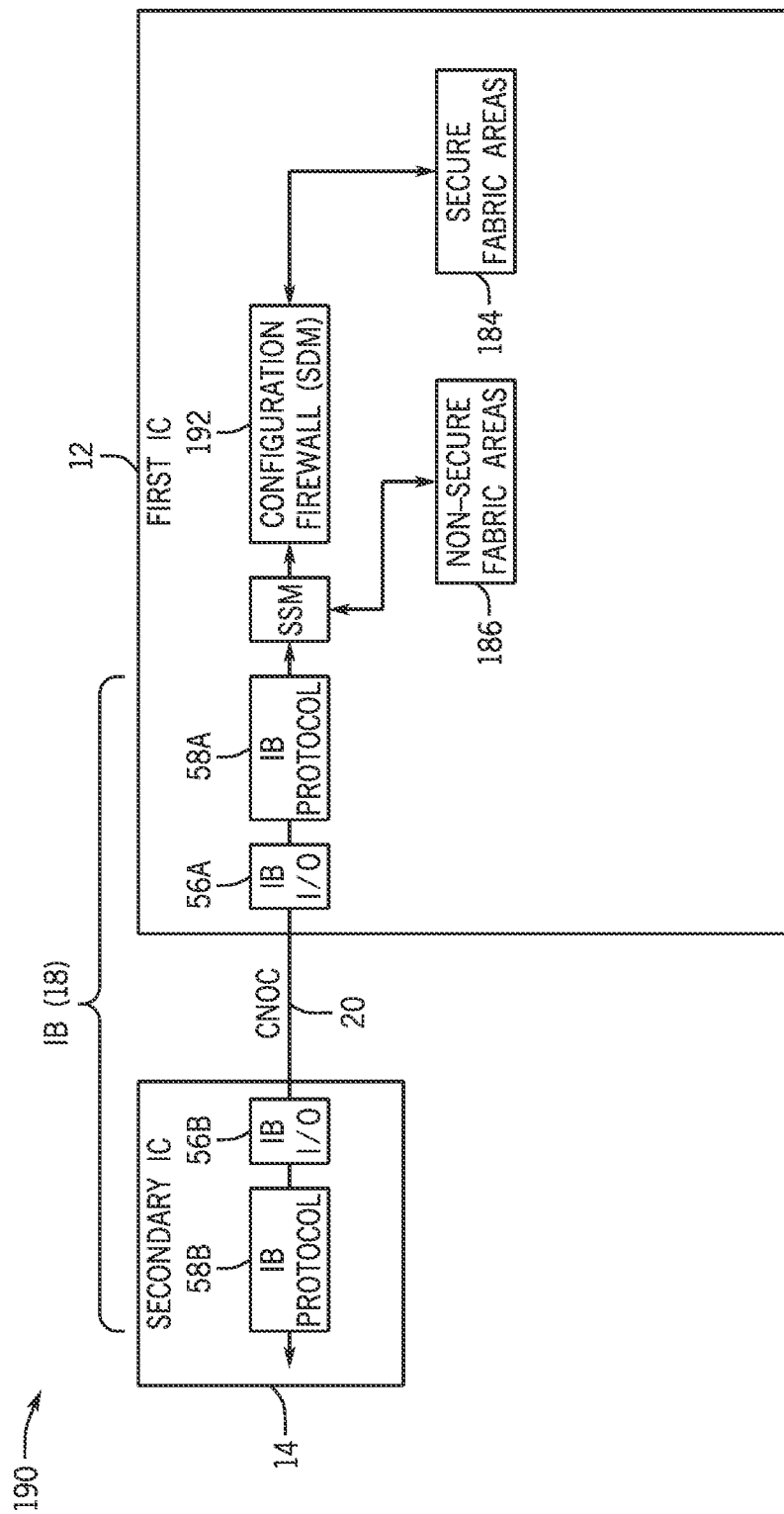
FIG. 14 is a block diagram illustrating secure configuration of programmable logic fabric of the first integrated circuit die by separating configuration signals (e.g., using a firewall) from the second integrated circuit die in a secure device manager of the first integrated circuit die, in accordance with an embodiment.

When the first IC die 12 includes programmable logic fabric, as shown by the FPGA fabric layer 60, the IB protocol layer 58A may include configuration (CONFIG) logic 68. This may include, for example, a firewall or other configuration signal processing logic to ensure that configuration data received via the interface bridge 18 is only given access to secure portions of the FPGA fabric layer 60 when this is authorized. In one embodiment, the CONFIG. logic 68 represents a dedicated path to a secure device manager (SDM) that separates access to secure areas of the FPGA fabric layer 60 (as shown in FIG. 14 and discussed further below). Because the secondary IC die 14 may allow configuration signals to be sent via the HSSI analog layer 66, the digital protocol layer 64, and/or the PCI express layer 62, these layers and the IB protocol layer 58B may include configuration logic 70. The configuration logic 70 may enable configuration signals to be received and sent to the FPGA fabric layer 60 to the IC die 12.

Figure 4:
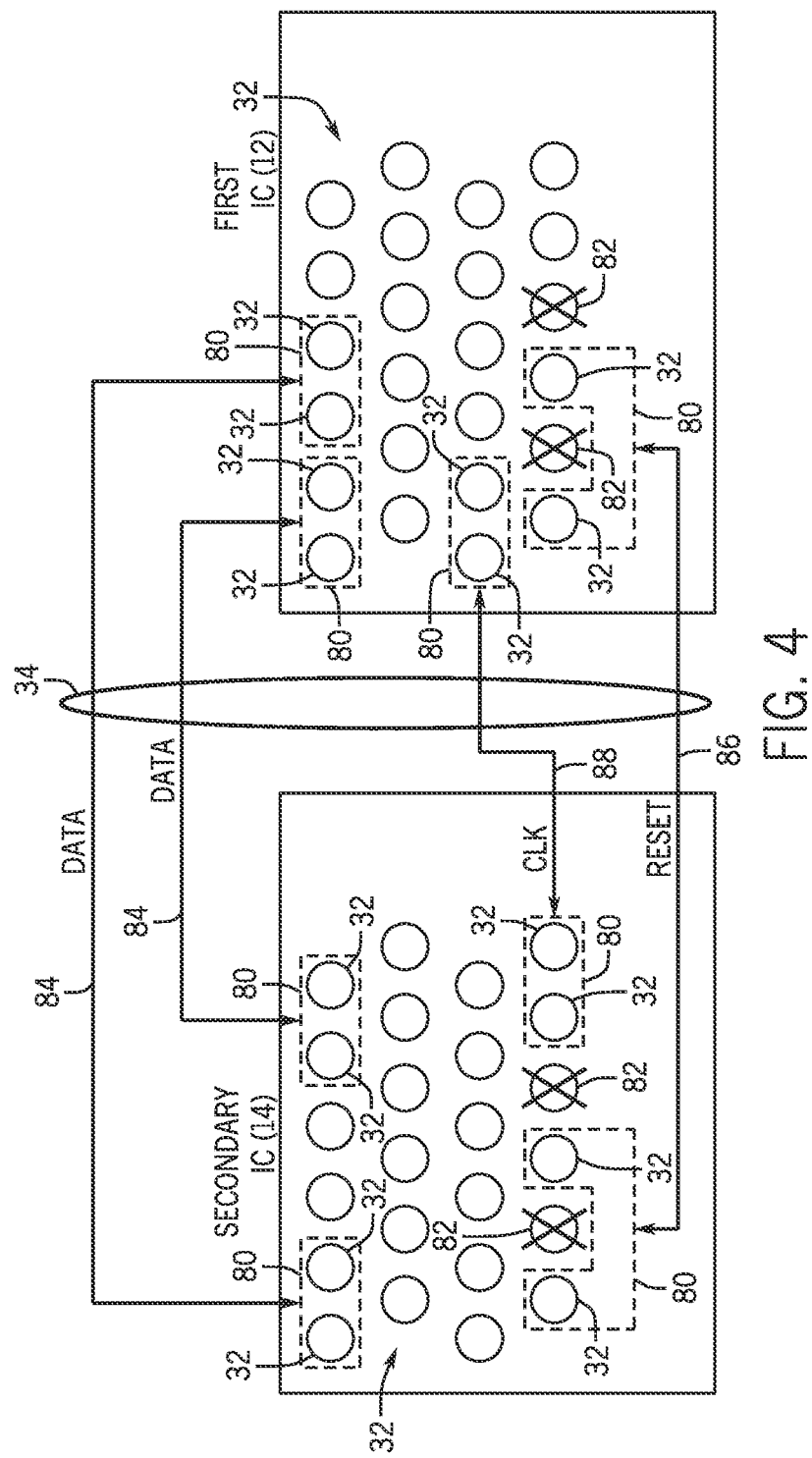
FIG. 4 is a schematic diagram illustrating logical and physical connections between interconnect points of a first integrated circuit die and a second integrated circuit die of the integrated circuit system of FIG. 1, in accordance with an embodiment.

FIG. 4 illustrates a mapping of some of the interconnect points 32 on the secondary IC die 14 to corresponding interconnect points 32 on the first IC die 12. To provide additional redundancy for the interface bridge 18, the interconnect points 32 on the first IC die 12 and the secondary IC die 14 may be grouped into pairs. For example, as shown in FIG. 4, the interconnect points 32 of the secondary IC die 14 may be grouped into pairs 80 that connect to a corresponding pair 80 of interconnect points 32 on the first IC die 12 through the chip-to-chip interconnects 34. In practice, each interconnect point 32 of the secondary IC die 14 is physically connected to a single other interconnect point 32 of the first IC die 12. However, the IB I/O layers 56A and 56B or the IB protocol layer 58A and 58B may logically group the interconnect points 32 into pairs 80. In the example of FIG. 4, the interconnect points 32 are microbumps that may physically connect the first IC die 12 and the secondary IC die 14 to the chip-to-chip interconnects 34 of the silicon bridge 16. However, the interconnect points 32 may take other forms (e.g., wire bonding, flip-chip interconnections, ball grid array (BGA), and so forth), depending on the number of particular physical connections that are used for communication for a particular purpose. For instance, fewer physical connections may be used in a serialized status interface protocol mode, which may enable communication of numerous asynchronous status or control signals to be communicated serially over many fewer wires. For example, such a serialized status interface protocol mode may be used to communicate around 50-100 or more asynchronous signals over a single serial connection (e.g., at least one data wire and at least one clock wire, or a single data wire with an embedded clock that is recovered on receipt).

Some of the interconnect points 32 may not support a connection because of a manufacturing defect or a latent failure that may arise during operation. These failures are represented in FIG. 4 as failed interconnect point connections 82. The IB I/O layer 56A and/or 56B or the IB protocol layer 58A and/or 58B may route around these failed interconnect points 82—that is, by shifting signals that would have been provided over a pair 80 that includes a failed interconnect point connection 82 instead to another pair 80. In one example, when there is a first pair 80 that includes a failed interconnect point connection 82, the signals that would have been carried over that pair 80 may be shifted to a first next adjacent pair 80, and the signals that would have been carried by the first next adjacent pair 80 may be shifted to a second next adjacent pair 80, and so forth. In other examples, a pair 80 may be formed from the two next adjacent functional interconnect points 32 (e.g., as shown in FIG. 4).

The pairs 80 of interconnect points 32 may be used to carry a variety of different types of signals. In one example, each pair 80 of interconnect points 32 may represent digital pins that can be configured into one of several different use models. A pair 80 of interconnect points 32 may operate, for example, as data pins 84 that can transfer data signals from a data bus on the secondary IC die 14 to a corresponding data bus on the first IC die 12 or vice versa. The data pins 84 may transfer data using a source-synchronous communication scheme, as will be discussed below.

Other pairs 80 of interconnect points 32 may operate as combinatorial signal pins 86, which may provide any signal that is not timed to a clock, such as a reset signal or such an external clock signal. In this mode, the pairs 80 of interconnect points 32 may operate where the IB protocol layers 58A and 58B are responsible for all timing. Under these conditions, the amount of delay may be modeled as approximately one bit time for the highest speed of the link. Depending on the circuitry used at the physical layer in the drivers and receivers of the physical layers 56A and 56B, this may be approximately 500 ps from driver input to receiver output. Some pairs 80 of interconnect points 32 may operate as combinatorial signal pins 88 that may behave in a similar way as a combinatorial pin 86, but which may connect into the IB I/O layer 56A or 56B to drive a clock tree to enable the received clock to act as a receive data clock signal for the source-synchronous communication scheme. With clock tree variance, process mix, lack of correlation between the different die, and other factors, this may run approximately 400 MHz or so as a synchronous system.

Figure 5:
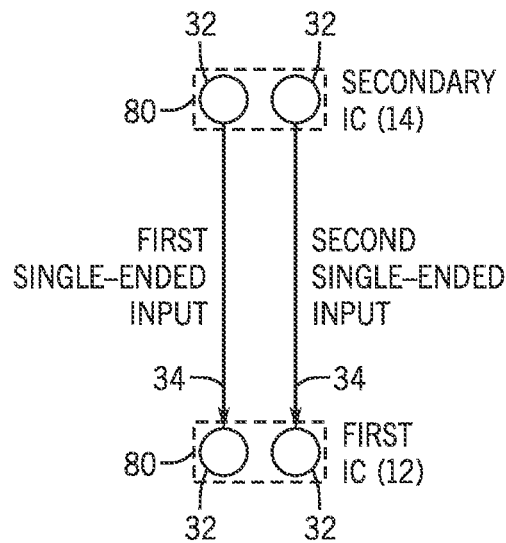
FIG. 5 is a schematic diagram illustrating a configuration of a pair of interconnect points as two single-ended inputs, in accordance with an embodiment.
Figure 7:
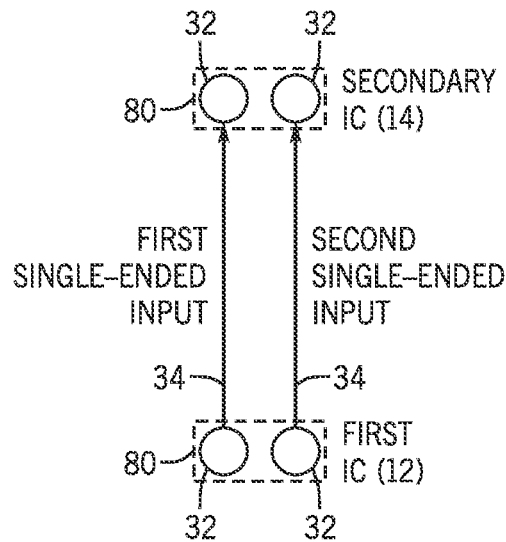
FIG. 7 is a schematic diagram illustrating a configuration of a pair of interconnect points as two single-ended differential inputs, in accordance with an embodiment.
Figure 8:
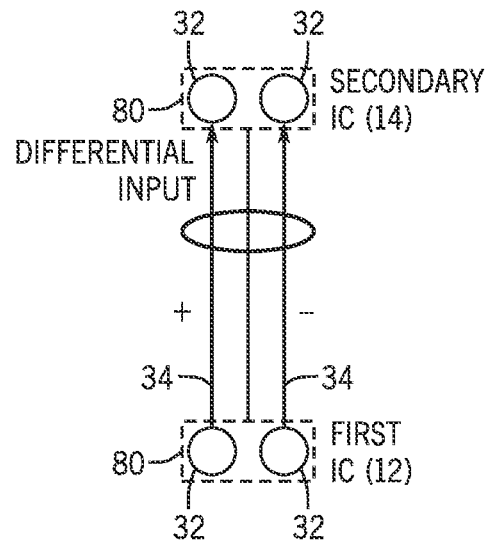
FIG. 8 is a schematic diagram illustrating a configuration of a pair of interconnect points as two single-ended differential outputs, in accordance with an embodiment.

Additionally or alternatively, some or all of the pairs 80 of interconnect points 32 may support multiple protocol layers efficiently through physical configurability. In one example, each pair 80 of interconnect points 32 may operate as two single-ended inputs (FIG. 5), two single-ended outputs (FIG. 6), a differential pair operating as an input (FIG. 7), or as a differential pair acting as an output (FIG. 8). In some embodiments, any corresponding pairs 80 of interconnect points 32 may be universally programmable by the IB I/O layer 56A or 56B or by the IB protocol layer 58A or 58B to behave in any of these configurations.

Figure 9:
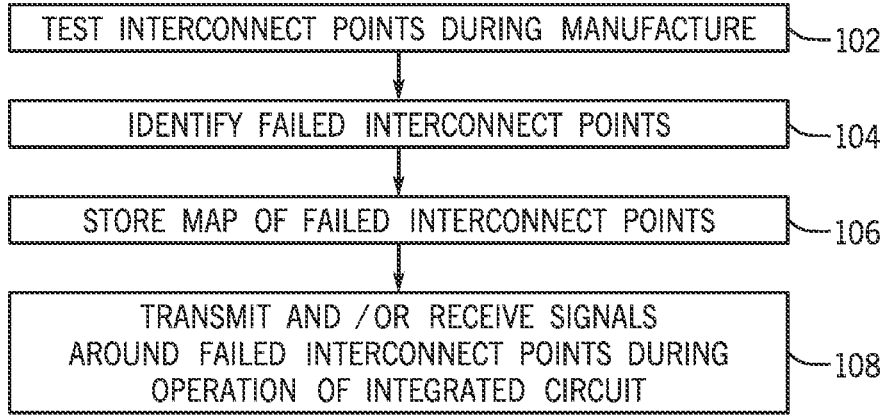
FIG. 9 is a flowchart of a method for active redundancy for communication between the first integrated circuit die and second integrated circuit die, in accordance with an embodiment.

Additional redundancies may be included in the interface bridge 18 to support a mixture of use models for the signals sent across the interface bridge 18. In one example, three types of redundancy may be incorporated in the interface bridge 18. These may include (1) active redundancy, (2) passive redundancy, and (3) encoded redundancy. A flowchart 100 of FIG. 9 represents one method for providing active redundancy to the interface bridge 18. The interconnect points 32 may be tested during manufacture (of the individual first IC die 12, the secondary IC die 14, or the IC system 10 on the silicon bridge 16) to identify which interconnect points 32 do not support a signal across the chip-to-chip interconnects 34 (block 102). Testing the interconnect points 32 and/or the corresponding chip-to-chip interconnects 34 may allow failed interconnect points 32 to be identified (block 104).

A mapping of the failed interconnect points 82 may be stored in the logic representing the IB I/O layers 56A and 56B or in the IB protocol layers 58A and 58B, using any suitable storage that can identify which of the interconnect points 32 represent failed interconnect points 82. In one example, each interconnect point has an associated register or fuse. In one example, these registers or fuses may be stored in a secure device manager (SDM) on the first IC die 14. In another example, the registers or fuses may be located at each interconnect point 32. Each register or fuse may be permanently programmed during manufacturing to indicate whether the interconnect point 32 has failed. For example, if the interconnect point 32 has failed, a fuse associate with the interconnect point 32 may be blown. In another example, a mapping structure may be stored in memory that stores an indication of all of the failed interconnect points 32 that may be accessible to the physical I/O layers 56A and 56B and/or the IB protocol layers 58A and 58B. Additionally or alternatively, a failure may be detected after manufacturing and during operation, if a signal that is intended to be sent is not able to be detected or is unable to be properly equalized upon receipt. In this case, the IB protocol layers 58A and 58B may communicate an indication to one another of the failure of the signal via other pairs 80 of interconnect points 32. The IB protocol layers 58A and 58B may store a record, which may be a permanent memory record, that indicates that the interconnect point 32 or the pair 80 of interconnect points 32 is not to be used.

Thereafter, during operation, the interface bridge 18 may avoid using the failed interconnect points 82, instead routing around the failed interconnect points 82 (block 108). As noted above, this may be done via the IB I/O layer 56A and/or 56B or the IB protocol layer 58A and/or 58B. The IB I/O layer 56A and/or 56B or the IB protocol layer 58A and/or 58B may shift signals that would have been provided over a pair 80 that includes a failed interconnect point connection 82 instead to another pair 80. In one example, when there is a first pair 80 that includes a failed interconnect point connection 82, the signals that would have been carried over that pair 80 may be shifted to a first next adjacent pair 80, and the signals that would have been carried by the first next adjacent pair 80 may be shifted to a second next adjacent pair 80, and so forth. In other examples, a pair 80 may be formed from the two next adjacent functional interconnect points 32 (e.g., as shown in FIG. 4).

Figure 6:
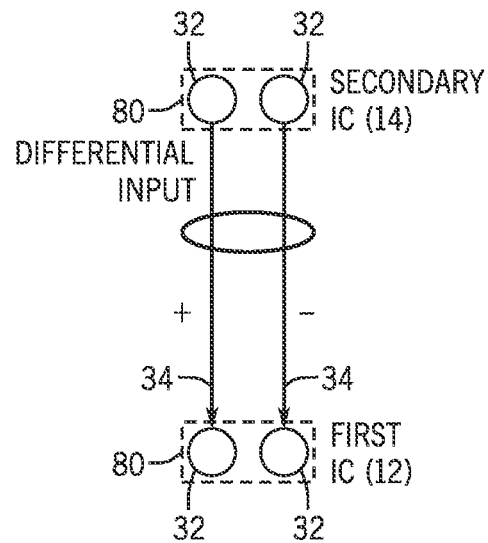
FIG. 6 is a schematic diagram illustrating a configuration of a pair of interconnect points as two single-ended outputs, in accordance with an embodiment.
Figure 10:
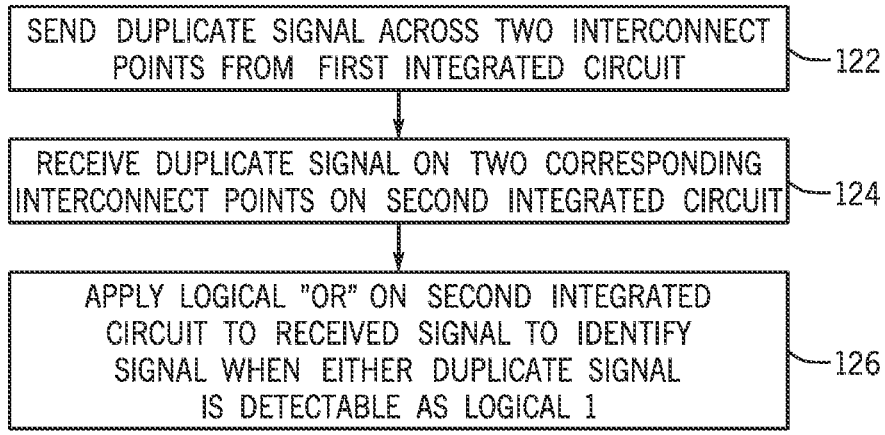
FIG. 10 is a flowchart of a method for passive redundancy of certain high-priority signals, in accordance with an embodiment.

An example of passive redundancy appears in a flowchart 120 of FIG. 10, which may be particularly valuable with certain high-priority signals. Passive redundancy may involve sending a duplicate signal across two interconnect points 32 from a first integrated circuit (e.g., from the first IC die 12 to the secondary IC die 14 or from the secondary IC die 14 to the first IC die 12) (block 102). In one example, this may entail sending a duplicate signal across a pair 80 of interconnect points 32 that have been configured as two single-ended outputs (FIG. 6). In another example, this may entail sending a duplicate signal across two pairs 80 of interconnect points 32, such as providing a duplicate signal across two pairs 80 of interconnect points 32 that are both configured as differential outputs (FIG. 8).

The duplicate signal may be received on a corresponding pair 80 of interconnect points 32 configured as two single-ended inputs (FIG. 5) or two corresponding pairs 80 of interconnect points 32 configured as differential outputs (FIG. 7) (block 124). The integrated circuit die that receives the duplicate signals may apply a logical "OR" on the signals to identify when either duplicate signal is detectable as a logical one (block 126). In some embodiments, a logical "NOR" may be applied to identify when either duplicate signal is detectable as a logical zero instead. Thus, the duplicate signal may be detected as long as one of these duplicate signals is successfully communicated through the interface bridge.

Figure 11:
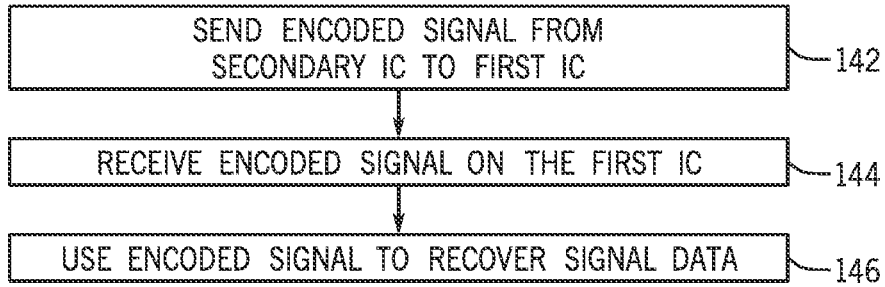
FIG. 11 is a flowchart of a method for encoded redundancy to enable programmable logic fabric to be securely configured on the first integrated circuit die, in accordance with an embodiment.

An example of encoded redundancy appears in a flowchart 140 of FIG. 11. Although the following example described in FIG. 14 describes transferring encoded data from the secondary IC die 14 to the first IC die 12, the same method may be used from the first IC die 12 to the secondary IC die 14. The flowchart 140 may began when the secondary IC die 14 sends an encoded configuration signal to the first IC die 12 (block 142). The first IC die 12 may receive the encoded signal (block 144). The first IC die 12 may decode the encoded signal and perform error checking of the encoded signal (e.g., calculating a syndrome using the encoded data) to recover data that may have become corrupted or lost in the data transfer (block 146). This may be particularly useful for certain highly valuable signals, such as configuration signals, which may enable the first IC die 12 to be reliably configured using configuration signals from the second IC die 14.

For instance, the first IC die 12 may receive configuration signals that may be used to configure the interface bridge 18 (e.g., whether certain interconnect points 32 operate as single-ended inputs or differential pairs), and error correction may be performed on these configuration signals before the interface bridge 18 is fully configured. Since the error checking of these high-value configuration signals may be performed by the interface bridge 18 before the interface bridge 18 is fully configured—for example, the interface bridge 18 may perform error checking on the very first configuration signals that are received by the interface bridge 18—this may substantially increase the redundancy and robustness of the interface bridge 18. The initial configuration signals may be transmitted across the interface bridge 18 using interconnect points 32 that have been designated in advance as the initial interconnect points 32 over which to receive the initial configuration signals. Any suitable interconnect points 32 may be defined in advance for use by the first IC die 12 and the second IC die 14.

Figure 12:
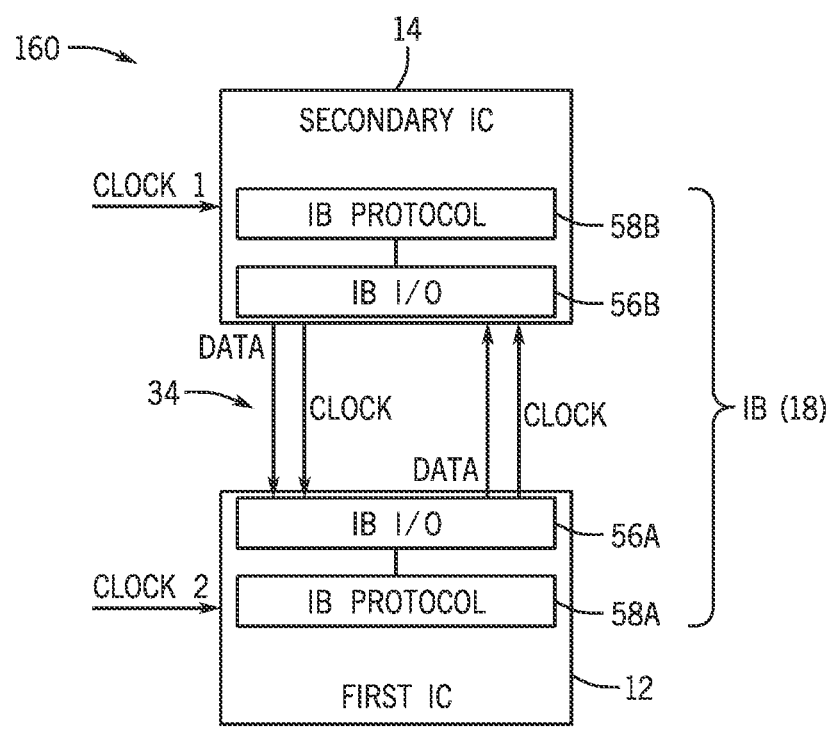
FIG. 12 is a block diagram of source-synchronous data communication using the interface bridge, in accordance with an embodiment.

Before continuing, it may be noted that the first IC die 12 and the secondary IC die 14 may communicate through the interface bridge 18 using a source synchronous data transfer connection at the physical level. One example of source synchronous data transfer 160 appears in FIG. 12. As shown in FIG. 12, the first IC die 12 and the secondary IC die 14 may receive and operate using different respective clock signals (shown in FIG. 12 as Clock 1 for the secondary IC die 14 and Clock 2 for the first IC die 12).

The source-synchronous communication scheme allows the different integrated circuit die to use separate clocks. In particular, the interface bridge 18 includes a data receive clock that may be independent of either the Clock 2 on the first IC die 12 or independent of the Clock 1 of the secondary IC die 14. In the example of FIG. 12, the IB I/O layer 56B and/or the IB protocol layer 58B on the secondary IC die 14 provide a data signal with a data receive clock signal (shown as "Clock") over the chip-on-chip interconnects 34. The IB I/O layer 56A and/or the IB protocol layer 58A on the first IC die 12 use the receive data clock "Clock" to receive the data as well as to send data to the secondary IC die 14. This makes the return signals to the secondary IC die 14 look synchronous from the perspective of the secondary IC die 14. Thus, from the perspective of the secondary IC die 14, communication with the first IC die 12 using the received-clock signal appears to be monolithic with the first IC die 12.

In one example, using the source-synchronous communication scheme of FIG. 12, data transfer over the interface bridge 18 may take place as a multi-bit double-data rate (DDR) source-synchronous data rate. The number of data bits per clock may be programmable in the IB I/O layers 56A or 56B, or the IB protocol layers 58A and 58B may be programmability as well for the clock source for each data pin. Nets on a source-synchronous bus may have relatively little variation in the routing between chips. As such, per-bit deskewing may be avoided.

Figure 13:
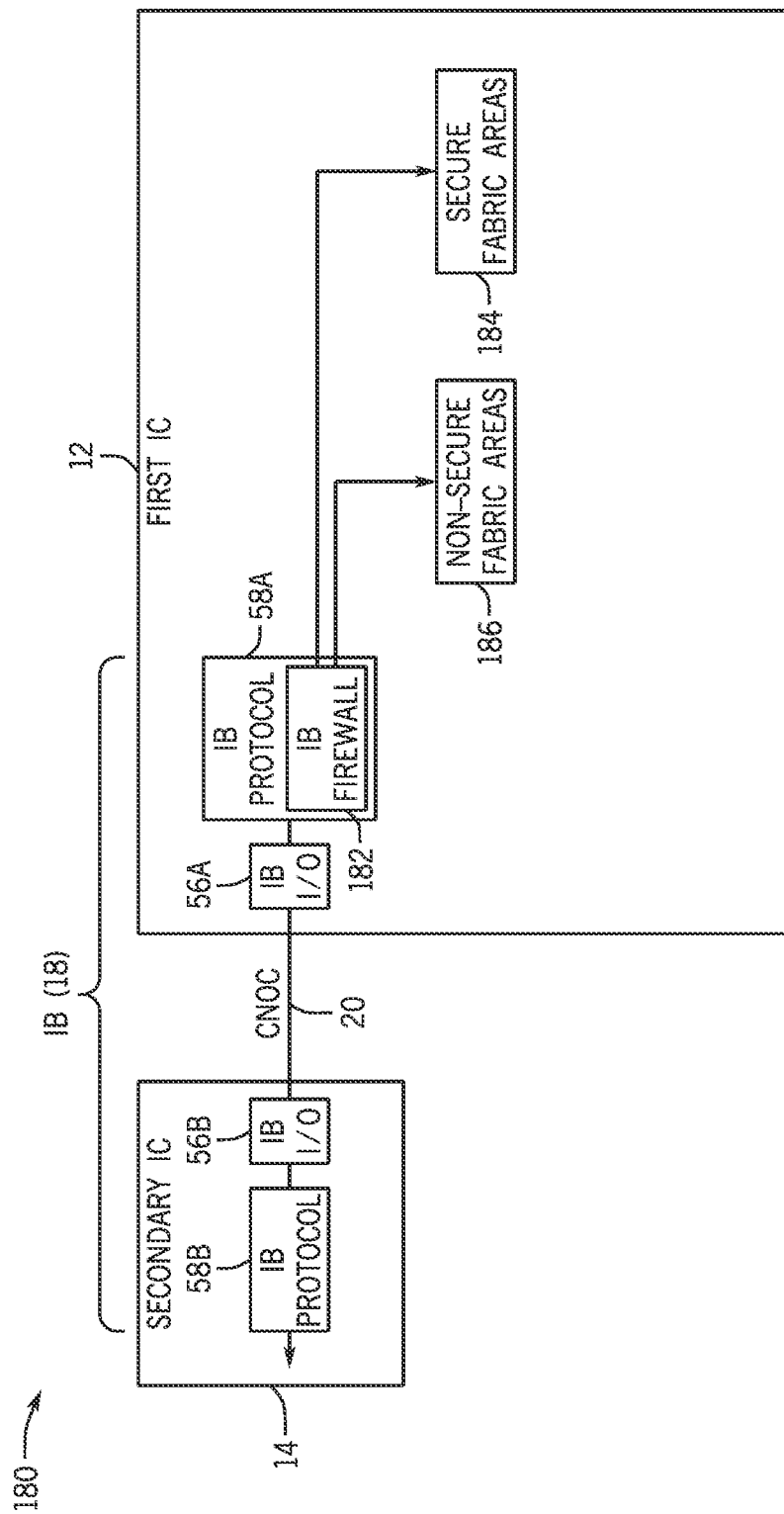
FIG. 13 is a block diagram illustrating secure configuration of programmable logic fabric of the first integrated circuit die by separating configuration signals (e.g., via a firewall) from the second integrated circuit die in the interface bridge, in accordance with an embodiment.

The interface bridge 18 may support any suitable number of programmable logic fabric configuration paths. In one example, shown by a block diagram 180 of FIG. 13, the interface bridge 18 provides a path logically connected via the configuration network-on-chip (CNOC) 20. To support security of the programmable logic fabric of the first IC die 12, CNOC 20 transactions from the secondary IC die 14 may be separated from other signals using any suitable signal-separation circuitry. In one example, the CNOC 20 transactions from the secondary IC die 14 may first run through an IB firewall 182 at the IB I/O layer 56A or, as illustrated in FIG. 13, the IB protocol layer 58A. The IB firewall 182 may operate to ensure any configuration signals from the secondary IC 14 to the first IC die 12 do not overwrite secure fabric areas 184 of the first IC die 12. Thus, the IB firewall 182 may prevent reading configuration data of secure fabric areas 184 unless certain specific characteristics are met (e.g., the request or configuration data has been properly authenticated). The IB firewall 182 may also provide dedicated access to non-secure fabric areas 186 of the IC die 12.

Additionally or alternatively, the CNOC 20 over the interface bridge 18 may be secured by different signal-separating circuitry (e.g., a firewall) that may be located on the first IC die 12. It should be appreciated that, in some embodiments, the IB firewall 182 may also be incorporated into the block diagram of FIG. 14. As shown in the example of FIG. 14, the first IC die 12 includes a configuration firewall 192 that may be a part of a secure device manager (SDM) (which may be accessible only through a dedicated path from a subsystem manager (SSM) 194). The configuration firewall 192 may coordinate reading from and writing to the secure fabric areas 184. By way of example, configuration data that is received by the secondary IC die 14 through, for example, PCI express configuration data, can be separated from other signals in a different place with a restriction that the traffic can only run with the duration firewall 192 via a dedicated path between the interface bridge 18 interface and the configuration firewall 192.

The interface bridge 18 may support a variety of higher-level communication protocols. These may include, among others, high-speed serial interface (HSSI) protocols such as a data transport protocol, a serialized status interface protocol, and/or a memory-mapped transport protocol.

The data transport protocol may operate as a double-data rate (DDR) version of a data interface. In some embodiments, the data transport may be single-data rate or may run faster than DDR depending on the number of new clocks that are desired to be used. In one example, as discussed above with reference to FIG. 12, a pure source-synchronous data transfer may be used. A data bus and any status bits that are sent along with the data may be sent across a data bus clocked to a source-synchronous clock signal. In general, for 28G operation, the data bus may run up to 40-bits wide or more at 1 Gb/s.

Another communication protocol that the interface bridge 18 may support includes a serialized status interface. The serialized status interface may provide a seemingly (from the perspective of the user) asynchronous transfer of status or control signals using a serial connection. The serial connection may provide the status bits as though they appear to be asynchronously transferred between the first IC die 12 and the secondary IC die 14. In other words, it should be understood that there are a large number of status bits that are communicated from the secondary IC die 14 to the first IC die 12, and vice versa. The serialized status interface protocol may emulate a parallel status interface that would be available in a monolithic design in which the separate secondary IC die 14 and the first IC die 12 were part of a single integrated circuit die. From the perspective of the first secondary IC die 14, the parallel status interface represents a register, which may be stored, serialized, and sent across a slim link (e.g., via one, two, or a few pairs 80 of interconnect points 32), and then deserialized on the side of the first IC die 12. In one example, the serialized communication that takes place involves a synchronization to the start of a serial frame transmission between the secondary IC die 14 and the first IC die 12. One manner of implementing this is to always send a complete frame of serial data. More complex implementations may send across a bit-toggling flag to allow bit toggles to be communicated. One particular example of the serialized status interface protocol is described by U.S. patent application Ser. No. 15/392,209, which is incorporated by reference herein within its entirety for all purposes.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. An integrated circuit device comprising:
    a substrate;
    a first integrated circuit (IC) die mounted on the substrate, the first IC die comprising a first plurality of input/output (IO) interfaces;
    a plurality of central processing unit (CPU) dies mounted on the substrate, at least one CPU die including an IO interface of a second plurality of IO interfaces;
    a plurality of chip-to-chip interconnects formed within the substrate to couple the first plurality of IO interfaces to the second plurality of IO interfaces, at least one chip-to-chip interconnect including single-ended data connections to communicate data and at least one clock connection to communicate clock signals,
    a first IO interface of the first plurality of IO interfaces comprising:
        a first physical layer (PHY) comprising a first plurality of drivers coupled to a corresponding first plurality of the single-ended data connections, and
        a first logical layer coupled to the physical layer to perform specified data processing functions;
    a second IO interface of a first CPU die of the plurality of CPU dies comprising a first plurality of receivers coupled to the first plurality of drivers over the corresponding first plurality of single-ended data connections;
    wherein the first IO interface is to transmit a clock signal to the second IO interface over the at least one clock connection, the second IO interface to use the clock signal to receive the data from the first plurality of single-ended data connections; and
    a management subsystem to utilize the plurality of chip-to-chip interconnects to communicate status and control information between the first IC die and the plurality of CPU dies, the management subsystem comprising first hardware logic in the first IC die and second hardware logic in the plurality of CPU dies, wherein the second hardware logic is to transmit status information over one or more of the single-ended data connections to the first hardware logic, the status information indicating an operational status of a respective CPU die, and wherein the first hardware logic is to transmit control signals over one or more of the single-ended data connections to the second hardware logic.

2. The integrated circuit device of claim 1 wherein the plurality of CPU dies are fabricated using a different lithography generation than the first IC die.

3. The integrated circuit device of claim 1 wherein the first IO interface further comprises:
    a second plurality of receivers coupled over a corresponding second plurality of the single-ended data connections to a corresponding second plurality of drivers of the second IO interface.

4. The integrated circuit device of claim 3 wherein each of the second plurality of IO interfaces is coupled to one of the first plurality of IO interfaces over a separate set of the chip-to-chip interconnects formed within the substrate, each separate set of chip-to-chip interconnects including a separate plurality of the single-ended data connections and at least one of the clock connections.

5. The integrated circuit device of claim 4 wherein the first IC die further comprises:
    a third IO interface to couple the integrated circuit device to a memory device.

6. The integrated circuit device of claim 5 wherein the first IC die further comprises:
    a fourth IO interface to couple the multi-die processor to one or more serial communication devices.

7. The integrated circuit device of claim 5 wherein the one or more serial communication devices comprise Peripheral Component Interconnect Express (PCIe) devices, wherein the fourth IO interface supports a PCIe protocol.

8. The integrated circuit device of claim 3 wherein each IO interface of the second plurality of IO interfaces comprises a plurality of layers including a second physical layer and a second logical layer.

9. The integrated circuit device of claim 8 wherein the second physical layer comprises the first plurality of receivers and the second plurality of drivers.

10. The integrated circuit device of claim 9 wherein the second logical layer is to process the status information transmitted to the first IC die and the control signals received from the first IC die.

11. The integrated circuit device of claim 10 wherein the logical layer is further to process a memory communication protocol.

12. The integrated circuit device of claim 1 wherein the control signals indicate configuration changes to be made to the CPU dies.

13. The integrated circuit device of claim 12 wherein the first logic is to separate the status information from the data received over the one or more single-ended data connections.

14. The integrated circuit device of claim 13 wherein the second logic comprises a first one or more registers to store the status information prior to transmission over the one or more single-ended data connections.

15. The integrated circuit device of claim 14 wherein the first logic comprises a second one or more registers to store the status information received from the CPU dies.

16. The integrated circuit device of claim 1 wherein the first IC die comprises a first plurality of connection points arranged on a bottom surface of the first IC die and the first CPU die comprises a second plurality of connection points arranged on a bottom surface of the first CPU die, wherein each of the plurality of data interconnects and the at least one clock interconnect electrically couple one of the first plurality of connection points to one of the second plurality of connection points.

17. The integrated circuit device of claim 16 wherein the first and second plurality of connection points comprise conductive bumps.

18. The integrated circuit die of claim 17 wherein the first and second plurality of connection points comprise microbumps, a microbump to be fixedly coupled to one of the data interconnects or the at least one clock interconnect when the first die and first CPU die are mounted on the substrate.

19. A system comprising:
a memory device; and
an integrated circuit device coupled to the memory device, the integrated circuit die comprising:
a substrate,
a first integrated circuit (IC) die mounted on the substrate, the first IC die comprising a first plurality of input/output (IO) interfaces,
a plurality of central processing unit (CPU) dies mounted on the substrate, at least one CPU die including an IO interface of a second plurality of IO interfaces,
a plurality of chip-to-chip interconnects formed within the substrate to couple the first plurality of IO interfaces to the second plurality of IO interfaces, at least one chip-to-chip interconnect including single-ended data connections to communicate data and at least one clock connection to communicate clock signals,
a first IO interface of the first plurality of IO interfaces comprising:
a first physical layer (PHY) comprising a first plurality of drivers coupled to a corresponding first plurality of the single-ended data connections, and
a first logical layer coupled to the physical layer to perform specified data processing functions,
a second IO interface of a first CPU die of the plurality of CPU dies comprising a first plurality of receivers coupled to the first plurality of drivers over the corresponding first plurality of single-ended data connections,
wherein the first IO interface is to transmit a clock signal to the second IO interface over the at least one clock connection, the second IO interface to use the clock signal to receive the data from the first plurality of single-ended data connections, and
a management subsystem to utilize the plurality of chip-to-chip interconnects to communicate status and control information between the first IC die and the plurality of CPU dies, the management subsystem comprising first hardware logic in the first IC die and second hardware logic in the plurality of CPU dies, wherein the second hardware logic is to transmit status information over one or more of the single-ended data connections to the first hardware logic, the status information indicating an operational status of a respective CPU die, and wherein the first hardware logic is to transmit control signals over one or more of the single-ended data connections to the second hardware logic.

20. The system of claim 19 wherein the plurality of CPU dies are fabricated using a different lithography generation than the first IC die.

21. The system of claim 19 wherein the first IO interface further comprises:
a second plurality of receivers coupled over a corresponding second plurality of the single-ended data connections to a corresponding second plurality of drivers of the second IO interface.

22. The system of claim 21 wherein each of the second plurality of IO interfaces is coupled to one of the first plurality of IO interfaces over a separate set of the chip-to-chip interconnects formed within the substrate, each separate set of chip-to-chip interconnects including a separate plurality of the single-ended data connections and at least one of the clock connections.

23. The system of claim 22 wherein the first IC die further comprises:
a third IO interface to couple the integrated circuit device to the memory device.

24. The system of claim 23 wherein the first IC die further comprises:
a fourth IO interface to couple the multi-die processor to one or more serial communication devices.

25. The system of claim 23 wherein the one or more serial communication devices comprise Peripheral Component Interconnect Express (PCIe) devices, wherein the fourth IO interface supports a PCIe protocol.

26. The system of claim 21 wherein each IO interface of the second plurality of IO interfaces comprises a plurality of layers including a second physical layer and a second logical layer.

27. The system of claim 26 wherein the second physical layer comprises the first plurality of receivers and the second plurality of drivers.

28. The system of claim 27 wherein the second logical layer is to process the status information transmitted to the first IC die and the control signals received from the first IC die.

29. The system of claim 28 wherein the logical layer is further to process a memory communication protocol.

30. The system of claim 19 wherein the control signals indicate configuration changes to be made to the CPU dies.

31. The system of claim 30 wherein the first logic is to separate the status information from the data received over the one or more single-ended data connections.

32. The system of claim 31 wherein the second logic comprises a first one or more registers to store the status information prior to transmission over the one or more single-ended data connections.

33. The system of claim 32 wherein the first logic comprises a second one or more registers to store the status information received from the CPU dies.

34. The system of claim 19 wherein the first IC die comprises a first plurality of connection points arranged on a bottom surface of the first IC die and the first CPU die comprises a second plurality of connection points arranged on a bottom surface of the first CPU die, wherein each of the plurality of data interconnects and the at least one clock interconnect electrically couple one of the first plurality of connection points to one of the second plurality of connection points.

35. The system of claim 34 wherein the first and second plurality of connection points comprise conductive bumps.

36. The system of claim 35 wherein the first and second plurality of connection points comprise microbumps, a microbump to be fixedly coupled to one of the data interconnects or the at least one clock interconnect when the first die and first CPU die are mounted on the substrate.

37. A method comprising:
providing a substrate;
mounting a first integrated circuit (IC) die on the substrate, the first IC die comprising a first plurality of input/output (IO) interfaces;
mounting a plurality of central processing unit (CPU) dies on the substrate, at least one CPU die including an IO interface of a second plurality of IO interfaces;
forming a plurality of chip-to-chip interconnects within the substrate to couple the first plurality of IO interfaces to the second plurality of IO interfaces, at least one chip-to-chip interconnect including single-ended data connections to communicate data and at least one clock connection to communicate clock signals;

a first IO interface of the first plurality of IO interfaces comprising:
- a first physical layer (PHY) comprising a first plurality of drivers coupled to a corresponding first plurality of the single-ended data connections, and
- a first logical layer coupled to the physical layer to perform specified data processing functions;

a second IO interface of a first CPU die of the plurality of CPU dies comprising a first plurality of receivers coupled to the first plurality of drivers over the corresponding first plurality of single-ended data connections;

wherein the first IO interface is to transmit a clock signal to the second IO interface over the at least one clock connection, the second IO interface to use the clock signal to receive the data from the first plurality of single-ended data connections; and wherein the plurality of chip-to-chip interconnects are to be utilized by a management subsystem to communicate status and control information between the first IC die and the plurality of CPU dies, the management subsystem comprising first hardware logic in the first IC die and second hardware logic in the plurality of CPU dies, wherein the second hardware logic is to transmit status information over one or more of the single-ended data connections to the first hardware logic, the status information indicating an operational status of a respective CPU die, and wherein the first hardware logic is to transmit control signals over one or more of the single-ended data connections to the second hardware logic.

38. The method of claim 37 wherein the plurality of CPU dies are fabricated using a different lithography generation than the first IC die.

39. The method of claim 37 wherein the first IO interface further comprises:
- a second plurality of receivers coupled over a corresponding second plurality of the single-ended data connections to a corresponding second plurality of drivers of the second IO interface.

40. The method of claim 39 wherein each of the second plurality of IO interfaces is coupled to one of the first plurality of IO interfaces over a separate set of the chip-to-chip interconnects formed within the substrate, each separate set of chip-to-chip interconnects including a separate plurality of the single-ended data connections and at least one of the clock connections.

41. The method of claim 40 wherein the first IC die further comprises:

a third IO interface to couple the integrated circuit device to a memory device.

42. The method of claim 41 wherein the first IC die further comprises:
- a fourth IO interface to couple the multi-die processor to one or more serial communication devices.

43. The method of claim 41 wherein the one or more serial communication devices comprise Peripheral Component Interconnect Express (PCIe) devices, wherein the fourth IO interface supports a PCIe protocol.

44. The method of claim 39 wherein each IO interface of the second plurality of IO interfaces comprises a plurality of layers including a second physical layer and a second logical layer.

45. The method of claim 44 wherein the second physical layer comprises the first plurality of receivers and the second plurality of drivers.

46. The method of claim 45 wherein the second logical layer is to process the status information transmitted to the first IC die and the control signals received from the first IC die.

47. The method of claim 46 wherein the logical layer is further to process a memory communication protocol.

48. The method of claim 39 wherein the first IC die comprises a first plurality of connection points arranged on a bottom surface of the first IC die and the first CPU die comprises a second plurality of connection points arranged on a bottom surface of the first CPU die, wherein each of the plurality of data interconnects and the at least one clock interconnect electrically couple one of the first plurality of connection points to one of the second plurality of connection points.

49. The method of claim 48 wherein the first and second plurality of connection points comprise conductive bumps.

50. The method of claim 49 wherein the first and second plurality of connection points comprise microbumps, a microbump to be fixedly coupled to one of the data interconnects or the at least one clock interconnect when the first die and first CPU die are mounted on the substrate.

51. The method of claim 37 wherein the control signals indicate configuration changes to be made to the CPU dies.

52. The method of claim 51 wherein the first logic is to separate the status information from the data received over the one or more single-ended data connections.

53. The method of claim 52 wherein the second logic comprises a first one or more registers to store the status information prior to transmission over the one or more single-ended data connections.

54. The method of claim 53 wherein the first logic comprises a second one or more registers to store the status information received from the CPU dies.

* * * * *